United States Patent [19]
Koike et al.

[11] Patent Number: 5,432,397
[45] Date of Patent: Jul. 11, 1995

[54] ZINC OXIDE PIEZOELECTRIC CRYSTAL FILM

[75] Inventors: Jun Koike; Hideharu Ieki, both of Kyoto, Japan

[73] Assignee: Murata Manufacturing Co., Ltd., Kyoto, Japan

[21] Appl. No.: 180,606

[22] Filed: Jan. 13, 1994

[30] Foreign Application Priority Data

Jan. 14, 1993 [JP] Japan .................. 5-005365

[51] Int. Cl.⁶ ............................................ H01L 41/08
[52] U.S. Cl. ................... 310/358; 310/313 A
[58] Field of Search ........... 310/334, 364, 360, 313 A, 310/358

[56] References Cited

U.S. PATENT DOCUMENTS

| | | | |
|---|---|---|---|
| 3,664,867 | 5/1972 | Galli et al. | 117/201 |
| 4,057,458 | 11/1977 | Maeda et al. | 156/603 |
| 4,164,676 | 8/1979 | Nishiyama et al. | 310/360 |
| 4,236,095 | 11/1980 | Ono et al. | 310/313 A |
| 4,501,987 | 2/1985 | Mitsuyu et al. | 310/313 A |
| 4,623,426 | 11/1986 | Peters | 156/614 |
| 5,061,870 | 10/1991 | Ieki et al. | 310/313 A |

OTHER PUBLICATIONS

Investigation of the Surface Acoustic Wave Properties of Heteroepitaxial ZnO layers on $Al_2O_3$; Frank Pizzarello (J. Appl. Phys., vol. 43, No. 9, Sep. 1972; pp. 3627–3631).

2.2 GHz SAW Filters Using $ZnO/Al_2O_3$ Structure; Tsuneo Mitsuyu, Shusuke Ono and Kiyotaka Wasa (Proceedings of 1st Symposium on Ultrasonic Electronics, Tokyo, 1980 Japanese Journal of Applied Physics, vol. 20 (1981) Supplement 20-3, pp. 99–102).

Control of Preferred Orientation for $ZnO_x$ Films: Control of Self-Texture; Norifumi Fujimura, Tokihiro Nishihara, Seiki Goto, Jifang Xu and Tiachiro Ito (Journal of Crystal Growth; 130 (1993) 269–279; North Holland).

Primary Examiner—Thomas M. Dougherty
Attorney, Agent, or Firm—Ostrolenk, Faber, Gerb & Soffen

[57] ABSTRACT

Disclosed herein is a zinc oxide piezoelectric crystal film which is grown on an R-plane sapphire substrate to orient its c-axis in parallel with the substrate surface. In order to improve orientation of the zinc oxide piezoelectric crystal film used is a Zn target for forming the zinc oxide piezoelectric crystal film by sputtering contains not more than 5 percent by weight of nickel or not more than 4.5 percent by weight of iron with respect to Zn.

9 Claims, 2 Drawing Sheets

ZINC OXIDE PIEZOELECTRIC CRYSTAL FILM

BACKGROUND OF THE INVENTION

Field of the Invention

The present invention relates to a zinc oxide piezoelectric crystal film which is grown on an R-plane sapphire substrate to orient its c-axis in parallel with the substrate surface, and more particularly, it relates to an improvement for attaining excellent orientation. Description of the Background Art A typical example of a piezoelectric substrate for a surface wave device comprises a piezoelectric crystal film which is provided on a non-piezoelectric substrate. In relation to a surface wave substrate of such a type, known is a surface wave substrate which is formed by a nonpiezoelectric substrate of sapphire ($\alpha$-$Al_2O_3$) and a piezoelectric crystal film of zinc oxide (ZnO).

FIG. 2 shows a surface wave substrate 3 comprising a ZnO piezoelectric crystal film 2 which is provided on a sapphire substrate 1. In relation to such a surface wave substrate 3, it is known that a ZnO piezoelectric crystal film 2 of a ($11\bar{2}0$) plane is grown on the sapphire substrate 1 when the same is prepared from ($01\bar{1}2$) plane cut sapphire, i.e., R-plane sapphire. It is also known that the surface wave substrate 3 provides a high sound velocity and high electromechanical coupling factor when the crystal planes of ZnO and $\alpha$-$Al_2O_3$ are oriented as ($11\bar{2}0$)ZnO//($01\bar{1}2$)$\alpha$-$Al_2O_3$ and crystal axes are regularized as [0001]ZnO//[$01\bar{1}1$]$\alpha$-$Al_2O_3$ as shown by arrows in FIG. 2, i.e., when the c-axis ([0001] direction) of ZnO is epitaxially grown in parallel with the substrate surface of the sapphire substrate 1.

In order to form a ZnO epitaxial film on sapphire, a process such as chemical transportation, CVD or sputtering is employed in general, while sputtering is widely employed among such processes, in particular.

When a pure ZnO thin film is formed on an R-plane sapphire substrate by sputtering, for example, its orientation is still insufficient for putting a piezoelectric substrate for a surface wave device which is formed by such a ZnO thin film into practice, although the c-axis in the ZnO thin film is regularized to some extent with respect to the substrate surface, i.e., a certain degree of orientation is attained. For example, the piezoelectric substrate is insufficient in piezoelectricity, and characteristics such as an electromechanical coupling factor are smaller than predetermined values.

SUMMARY OF THE INVENTION

Accordingly, an object of the present invention is to attain improvement in crystal orientation of a zinc oxide piezoelectric crystal film which is epitaxially grown on the aforementioned R-plane sapphire substrate.

The present invention is directed to a zinc oxide piezoelectric crystal film which is grown on an R-plane sapphire substrate to orient its c-axis in parallel with the substrate surface, and characterized in that the zinc oxide piezoelectric crystal film contains a transition metal.

The aforementioned transition metal is prepared from nickel or iron, for example. When nickel is employed, its content is selected preferably to be not more than 5 percent by weight, more preferably in a range of 0.6 to 4 percent by weight, and most preferably in a range of 1 to 3.1 percent by weight with respect to zinc. When iron is employed, on the other hand, its content is selected preferably to be not more than 4.5 percent by weight, more preferably in a range of 0.6 to 3 percent by weight, and most preferably in a range of 0.9 to 2 percent by weight with respect to zinc.

It has been proved by the present invention that a zinc oxide piezoelectric crystal film containing a transition metal such as nickel or iron exhibits excellent orientation, as clearly understood from the following description of an embodiment.

According to the present invention, therefore, it is possible to put a surface wave substrate which is formed by a zinc oxide piezoelectric crystal film into practice in a surface wave device.

DESCRIPTION OF THE PREFERRED EMBODIMENTS

Figure 2:
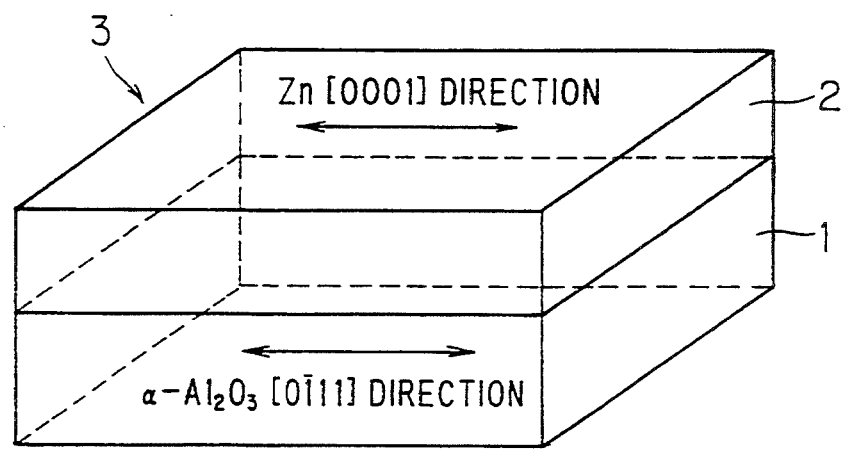
FIG. 2 is a perspective view illustrating a surface wave substrate 3 to be obtained by the present invention.

As shown in the aforementioned FIG. 2, processes of forming the ($11\bar{2}0$) plane ZnO epitaxial piezoelectric crystal film 2 on the R-plane sapphire substrate 1 include chemical transportation, CVD and sputtering, while it is possible to obtain a ZnO epitaxial film which is excellent in surface flatness with high quality crystals at a lower temperature by sputtering, in particular.

Figure 3:
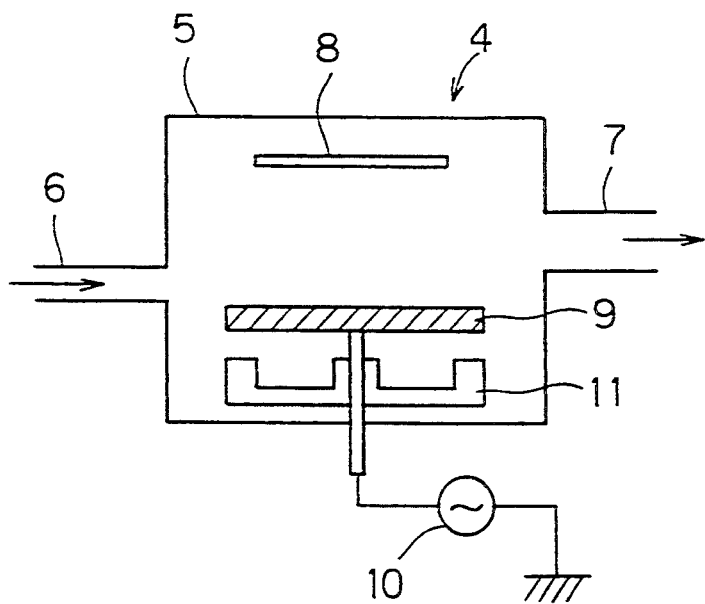
FIG. 3 is a sectional view illustrating a sputterer

FIG. 3 shows an RF magnetron sputtering equipment or system 4. This sputterer 4 comprises an airtight container 5, which is provided with a gas inlet port 6 and an exhaust port 7. A substrate 8 and a target 9 are arranged in the airtight container 5 in an opposite manner, and a high-frequency (RF) power source 10 applies a high-frequency voltage across an anode (not shown) and a cathode (not shown) which are positioned on upper and lower surfaces of the substrate 8 and the target 9 respectively. A magnet 11 is located under the target 9.

In sputtering by the aforementioned sputtering equipment or system 4, the target 9 which is prepared from ZnO ceramic or a Zn metal is struck by particles of argon or the like introduced from the gas inlet port 6, so that zinc oxide particles thereby jumping out adhere onto the substrate 8, or so that zinc particles as jumping out are reacted with gaseous oxygen to form zinc oxide, which in turn adheres onto the substrate 8.

In the following experiment, targets 9 were prepared from those of pure Zn metal, Zn metal doped with nickel and Zn metal doped with iron respectively, to form ZnO thin films on substrates 8 of R-plane sapphire by RF magnetron sputtering through the sputtering equipment or system 4 under various sputtering conditions. RF power, a substrate temperature and a gas ($Ar:O_2 = 50:50$) pressure were varied in relation to the aforementioned sputtering conditions.

The as-obtained ZnO thin films were evaluated by an X-ray diffractmeter process, which is adapted to evaluate crystallinity by diffracted waves obtained by irradiating samples with X-rays. In the ZnO epitaxial films obtained by this experiment, peaks were obtained by diffracted waves from crystal planes which were parallel to the substrates, i.e., ($11\bar{2}0$) planes of ZnO. Orientation properties were improved to implement high quality films having crystal planes regularized further in parallel as the peak strength values were increased and peak widths at positions half the peak heights, i.e., half band widths were reduced.

Table 1 shows strength values and half band widths of diffraction peaks of ZnO($11\bar{2}0$) planes obtained by employing pure Zn targets and ZnO targets (Zn-Ni targets) doped with 3 percent by weight of Ni with respect to Zn respectively, forming films under various sputtering conditions and analyzing the same by an X-ray diffractmeter process.

TABLE 1

| [Sputtering Condition] | 1 | 2 | 3 | 4 | 5 |
|---|---|---|---|---|---|
| RF Power (kW) | 2.2 | 2.2 | 2.2 | 1.0 | 1.0 |
| Substrate Temperature (°C.) | 130 | 200 | 250 | 200 | 200 |
| Gas Pressure ($\times 10^{-3}$ Torr) | 5 | 5 | 5 | 5 | 7.6 |
| [ZnO ($11\bar{2}0$) Plane Peak Strength (cps)] | | | | | |
| Zn Target | 3600 | 4000 | 4400 | 1200 | 4800 |
| Zn—Ni Target | 40000 | 16400 | 10800 | 55000 | 130000 |
| [ZnO ($11\bar{2}0$) Plane Peak Half Band Width (°)] | | | | | |
| Zn Target | 2.6 | 1.5 | 1.3 | 2.0 | 1.3 |
| Zn—Ni Target | 0.45 | 0.80 | 1.00 | 0.60 | 0.40 |

As understood from Table 1, the ZnO thin films prepared from the targets which were doped with nickel had higher diffraction peak strength values and smaller peak half band widths under all sputtering conditions. Thus, these films can be regarded as having superior crystallinity. When such a ZnO/sapphire substrate is employed as a material for a surface wave substrate, the half band width of the diffraction peak is preferably smaller than about 0.8° in practice. In this point, no films having excellent practicality were obtained under all sputtering conditions, when the pure Zn targets were employed. When the targets were doped with nickel, on the other hand, sufficiently practical ZnO epitaxial films were obtained under proper sputtering conditions.

Table 2 shows peak strength values and peak half band widths obtained when nickel contents were changed between 0 and 7 percent by weight with respect to zinc under the sputtering conditions exhibiting the smallest diffraction peak half band width, i.e., conditions 5 (RF power: 1 kW, substrate temperature: 200° C. and gas pressure: 7.6 by $10^{-3}$ Torr) among those shown in Table 1.

TABLE 2

| Ni Content (wt %) | ZnO ($11\bar{2}0$) Plane Peak Strength (cps) | ZnO ($11\bar{2}0$) Plane Peak Half Band Width (°) |
|---|---|---|
| 0 | 4800 | 1.3 |
| 1 | 96000 | 0.45 |
| 3 | 130000 | 0.40 |
| 5 | 9200 | 1.15 |
| 7 | 3800 | 2.1 |

Figure 1:
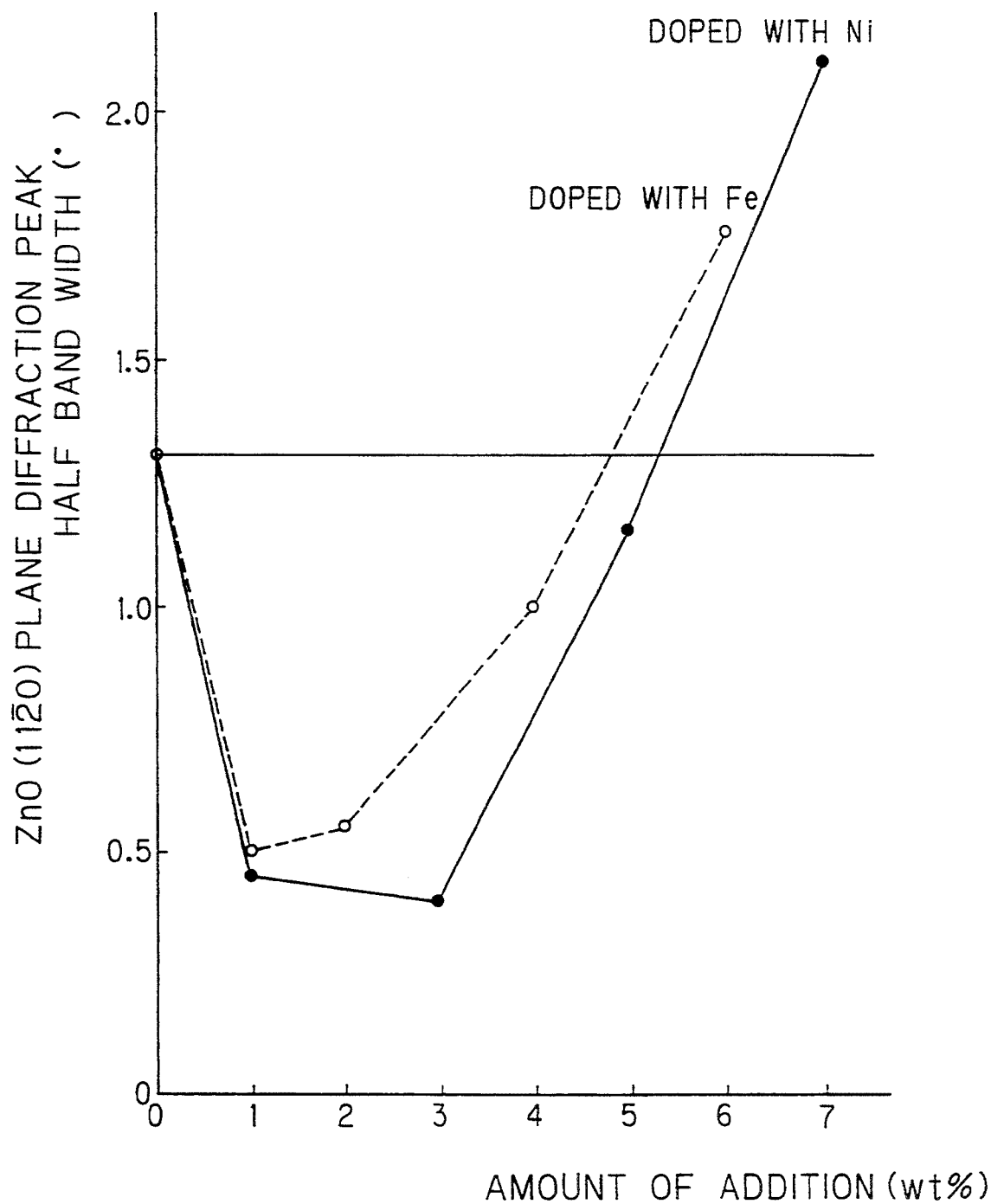
FIG. 1 illustrates changes of diffraction peak half band widths in ZnO thin films with respect to amounts of addition of nickel and iron to Zn targets, which were confirmed in Example of the present invention.

FIG. 1 shows relations between the peak half band widths shown in Table 2 and the Ni contents. It is understood from Table 2 and FIG. 1 that crystallinity was improved as compared with the case of employing the Zn targets containing no nickel when the nickel contents were not more than 5 percent by weight. When nickel was added by 7 percent by weight, a diffraction peak from a (0001) plane was also slightly observed in addition to that from a ($11\bar{2}0$) plane in diffracted waves from the ZnO thin film, which was not a complete epitaxial film.

Films prepared from Zn targets which were doped with iron were also examined. Tables 3 and 4 show the results. Table 3 and 4 correspond to the above Tables 1 and 2 respectively.

TABLE 3

| [Sputtering Condition] | 1 | 2 | 3 | 4 | 5 |
|---|---|---|---|---|---|
| RF Power (kW) | 2.2 | 2.2 | 1.5 | 1.0 | 1.0 |
| Substrate Temperature (°C.) | 130 | 200 | 200 | 200 | 200 |
| Gas Pressure ($\times 10^{-3}$ Torr) | 5 | 5 | 5 | 5 | 7.6 |
| ZnO ($11\bar{2}0$) Plane Peak Strength (cps) | 42000 | 14600 | 22000 | 34800 | 74500 |
| ZnO ($11\bar{2}0$) Plane Peak Half Band Width (°C.) | 0.60 | 0.70 | 0.65 | 0.60 | 0.55 |

TABLE 4

| Fe Content (wt %) | ZnO ($11\bar{2}0$) Plane Peak Strength (cps) | ZnO ($11\bar{2}0$) Plane Peak Half Band Width (°) |
|---|---|---|
| 0 | 4800 | 1.30 |
| 1 | 89600 | 0.50 |
| 2 | 74500 | 0.55 |
| 4 | 6100 | 1.00 |
| 6 | 4300 | 1.75 |

FIG. 1 also shows relations between the peak half band widths shown in Table 4 and the Fe contents. From Tables 3 and 4 and FIG. 1, it is possible to confirm that the as-obtained ZnO thin films were also improved in crystallinity when the Zn targets doped with iron were employed. As understood from Table 4 and FIG. 1 in particular, the films prepared from the Zn targets which were doped with iron were improved in crystallinity as compared with those prepared from the Zn targets which were doped with no iron, when the Fe contents were not more than 4.5 percent by weight with respect to zinc. Also when the Zn target containing 6 percent by weight of iron was employed, a diffraction peak from a (0001) plane was also slightly observed in addition to that from a ($11\bar{2}0$) plane in the as-obtained ZiO thin film, which was not a complete epitaxial film, similarly to the aforementioned film which was prepared from the target containing 7 percent by weight of nickel.

The content of nickel or iron is shown as a value in the Zn target in the above description, while the content in the target can be regarded as the content of nickel or iron in the as-obtained ZnO thin film with respect to Zn since compositions of the target and the as-obtained film substantially match with each other in sputtering.

Although the transition metal is prepared from nickel or iron in the aforementioned embodiment, still another transition metal such as cobalt, for example, can also be advantageously employed in the present invention.

The "R-plane" of sapphire employed as a substrate in the present invention is a ($01\bar{1}2$) plane, while dispersion of about ±2 degrees appears with respect to the R-plane in practice. However, the effect substantially remains the same within such a range of dispersion. Even if a cut plane of sapphire is displaced by about ±2 degrees, therefore, it is possible to obtain a ZnO epitaxial film of a ($11\bar{2}0$) plane. Namely, the term "R-plane"

employed in this specification is not necessarily restricted to an "R-plane" in a strict sense.

What is claimed is:

1. A zinc oxide piezoelectric crystal film grown on a R-plane sapphire substrate to orient its c-axis in parallel with a surface of said substrate, said zinc oxide piezoelectric crystal film containing a transition metal whereby the orientation of the film on the sapphire relative to that in the absence of the transition metal is improved and wherein the transition metal includes nickel in an amount of not more than 5% based on the zinc or includes iron in an amount of not more than 4.5% based on the zinc.

2. A zinc oxide piezoelectric crystal film in accordance with claim 1, wherein said transition metal includes nickel.

3. A zinc oxide piezoelectric crystal film in accordance with claim 2, wherein the content of said nickel is not more than 5 percent by weight with respect to zinc.

4. A zinc oxide piezoelectric crystal film in accordance with claim 2, wherein the content of said nickel is in the range of 0.6 to 4 percent by weight with respect to zinc.

5. A zinc oxide piezoelectric crystal film in accordance with claim 2, wherein the content of said nickel is in the range of 1 to 3.1 percent by weight with respect to zinc.

6. A zinc oxide piezoelectric crystal film in accordance with claim 1, wherein said transition metal includes iron.

7. A zinc oxide piezoelectric crystal film in accordance with claim 6, wherein the content of said iron is not more than 4.5 percent by weight with respect to zinc.

8. A zinc oxide piezoelectric crystal film in accordance with claim 6, wherein the content of said iron is in the range of 0.6 to 3 percent by weight with respect to zinc.

9. A zinc oxide piezoelectric crystal film in accordance with claim 6, wherein the content of said iron is in the range of 0.9 to 2 percent by weight with respect to zinc.

* * * * *